US006987355B2

(12) United States Patent
Cok

(10) Patent No.: US 6,987,355 B2
(45) Date of Patent: Jan. 17, 2006

(54) STACKED OLED DISPLAY HAVING IMPROVED EFFICIENCY

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 199 days.

(21) Appl. No.: 10/459,685

(22) Filed: Jun. 11, 2003

(65) Prior Publication Data

US 2004/0251821 A1 Dec. 16, 2004

(51) Int. Cl.
*H05B 33/14* (2006.01)
*H05B 33/26* (2006.01)
*H05B 33/24* (2006.01)

(52) U.S. Cl. .................. 313/506; 313/503; 313/504; 313/505; 313/501; 313/509; 313/110; 313/111; 313/112; 428/690; 257/99; 257/98; 257/100

(58) Field of Classification Search ............ 313/504, 313/503, 501, 506, 509, 110, 111, 112; 428/690; 257/99, 98, 100
See application file for complete search history.

(56) References Cited

U.S. PATENT DOCUMENTS

| | | | |
|---|---|---|---|
| 4,983,464 A | * | 1/1991 | Holzer et al. ............... 428/442 |
| 5,507,404 A | * | 4/1996 | Ryu ........................... 216/24 |
| 5,703,436 A | | 12/1997 | Forrest et al. |
| 5,837,391 A | * | 11/1998 | Utsugi ........................ 428/690 |
| 6,274,980 B1 | | 8/2001 | Burrows et al. |
| 6,366,025 B1 | | 4/2002 | Yamada |
| 2002/0024618 A1 | | 2/2002 | Imai |
| 2002/0186214 A1 | | 12/2002 | Siwinski |
| 2002/0197511 A1 | | 12/2002 | D'Andrade et al. |

OTHER PUBLICATIONS

Klompenhouwer et al., Subpixel Image Scaling for Color Matrix Displays, *SID 02 Digest*, 2002, pp. 176–179.

* cited by examiner

*Primary Examiner*—Nimeshkumar D. Patel
*Assistant Examiner*—Elizabeth Rielley
(74) *Attorney, Agent, or Firm*—Thomas H. Close

(57) ABSTRACT

An OLED device, having a pixel includes a plurality of individually addressable first white light emitting elements; a corresponding plurality of color filters located over the first white light emitting elements to filter the light emitted by the first white light emitting elements; and a second separately addressable white light emitting element located over the color filters for passing the filtered white light and emitting white light.

27 Claims, 5 Drawing Sheets

STACKED OLED DISPLAY HAVING IMPROVED EFFICIENCY

FIELD OF THE INVENTION

The present invention relates to OLED color displays and, more particularly, to arrangements of light emitting elements in the pixels of such OLED color displays.

BACKGROUND OF THE INVENTION

U.S. application Ser. No. 2002/0186214A1, by Siwinski, published Dec. 12, 2002, shows a method for saving power in an organic light emitting diode (OLED) display having pixels comprised of red, green, blue and white light emitting elements. The white light emitting elements are more efficient than the other colored light emitting elements and are employed to reduce the power requirements of the display.

OLED devices age as current passes through the emissive materials of the display. Specifically, the emissive materials age in direct proportion to the current density passing through the materials. Hence, the solution proposed by Siwinski will have the effect of either reducing the size of the emissive elements (if four elements occupy the same area as three elements), or reducing the resolution of the device (if four elements take more area than three elements). Therefore, the design of Siwinski will result in either reduced lifetime or reduced resolution compared to a prior art three element design.

One approach to dealing with the aging problem, while maintaining the resolution of the display, is to stack the OLED light emitting elements on top of each other thereby allowing the areas of the light emitting elements to be larger to improve lifetime, and/or allowing more pixels to be provided for a given area, thereby improving resolution. This approach is described in U.S. Pat. No. 5,703,436 issued Dec. 30, 1997 to Forrest et al. and U.S. Pat. No. 6,274,980 issued Aug. 14, 2001 to Burrows et al. Stacked OLEDs utilize a stack of light emitting elements located one above another over a substrate. Each light emitting element is individually controlled using conventional controllers. Power is supplied to the light emitting elements from the controller through transparent electrodes which may be shared between light emitting elements adjacent to each other in the stack. However, such stacked structures do not improve the efficiency of the pixels in the display.

It is also known that different OLED materials for emitting different colors of light age at different rates as they are used. It is has been proposed to provide an OLED display having pixels with differently sized red, green and blue light emitting elements, wherein the relative sizes of the elements in a pixel are selected according to their relative aging characteristics to extend the service life of the display. See U.S. Pat. No. 6,366,025 B1, issued Apr. 2, 2002 to Yamada.

It has been known for many years that the human eye is most sensitive to green light and less sensitive to red and blue light. More specifically, the spatial resolution of the human visual system is driven primarily by the luminance rather than the chrominance of a signal. Since green light provides the preponderance of luminance information in typical viewing environments, the spatial resolution of the visual system during normal daylight viewing conditions is highest for green light, lower for red light, and even lower for blue light when viewing images generated by a typical color balanced image capture and display system. This fact has been used in a variety of ways to optimize the frequency response of imaging systems. For example, as described in U.S. application Ser. No. 2002/0024618 by Imai, published Feb. 28, 2002, in a pixel having a square array of red, green, blue and white light emitting elements, the colors green and white having large luminance components are positioned diagonally opposite in the array. However, the Imai design does not provide increased power efficiency for an emissive full color display.

There is a need, therefore, for an improved full color flat panel OLED display having improved lifetime and power efficiency and a simpler construction.

SUMMARY OF THE INVENTION

The need is met according to the present invention by providing an OLED device, having a pixel that includes a plurality of individually addressable first white light emitting elements; a corresponding plurality of color filters located over the first white light emitting elements to filter the light emitted by the first white light emitting elements; and a second separately addressable white light emitting element located over the color filters for passing the filtered white light and emitting white light.

BRIEF DESCRIPTION OF THE DRAWINGS

FIG. 2 is a more detailed view of the OLED pixel of FIG. 1a;

DETAILED DESCRIPTION OF THE INVENTION

Figure 1A:
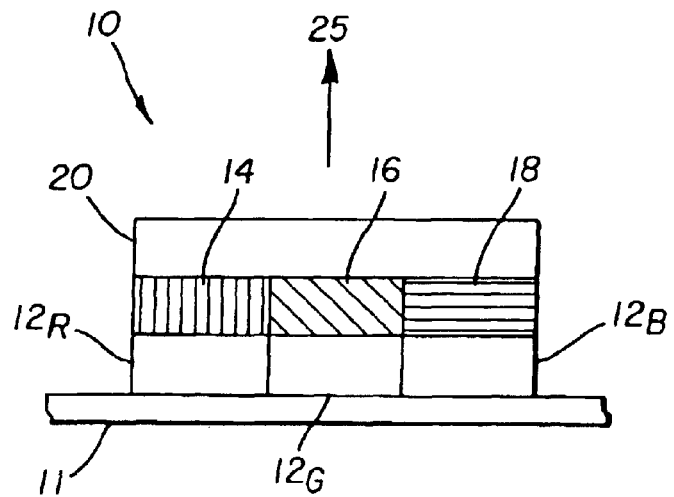
FIGS. 1a and b are schematic side views of top and bottom emitting stacked OLED pixels, respectively, according to one embodiment of the present invention.

Referring to FIG. 1a, a top emitting OLED device according to the present invention includes a color pixel 10 located on a substrate 11 having a plurality of individually addressable first white light emitting elements $12_R$, $12_G$, $12_B$; a corresponding plurality of color filters 14, 16, and 18 respectively located over the first white light emitting elements $12_R$, $12_G$, $12_B$ to emit colored light. A second separately addressable white light emitting element 20 is located over the color filters. It is possible to use a clear (white light) filter (not shown) in conjunction with the color filters to, for example, improve process or materials stability and layer interactions. Suitable filters are known in the art, for example dichroic filters and absorption filters made of dyes or pigments.

Figure 1B:
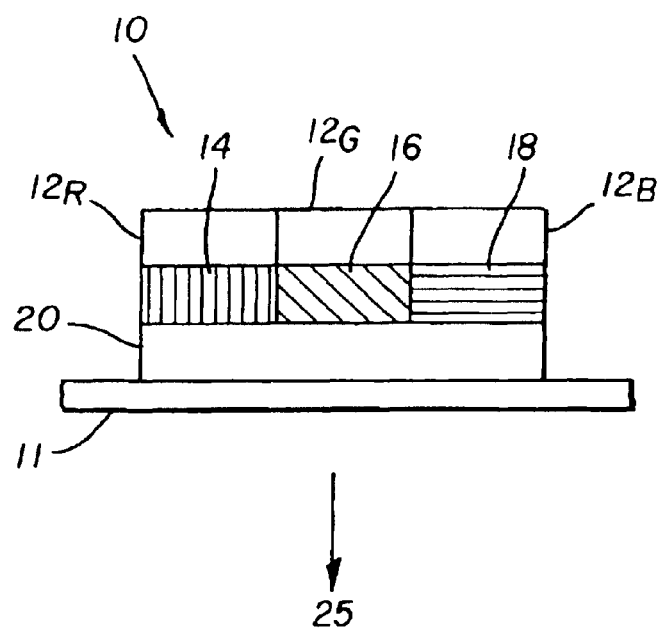
Figure 2:
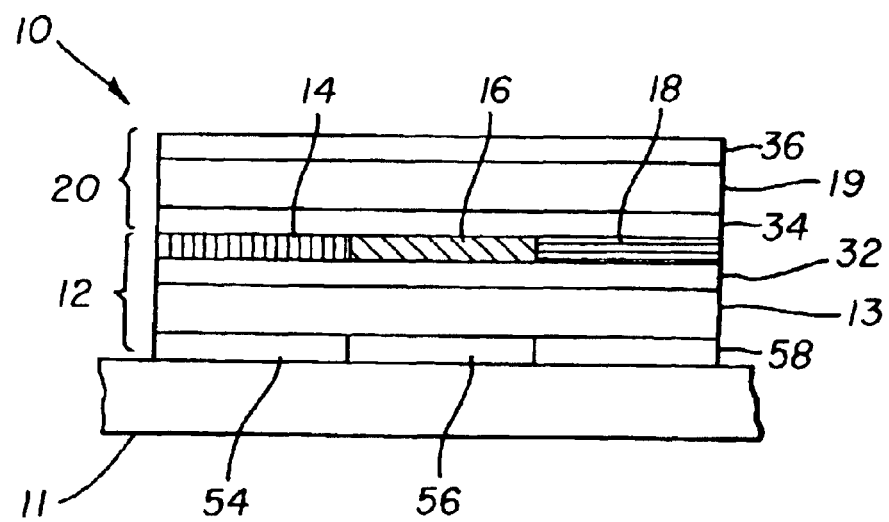

Alternatively, the OLED device may be bottom emitting (as shown in FIG. 1b) wherein the second white light emitting element 20 is on the substrate 11 and light 25 is emitted through the substrate. Referring to FIG. 2, the color light emitting element 12 includes electrodes 54, 56, and 58;

a layer of white light emitting material 13 and a common electrode 32. The electrodes 54, 56, and 58 are located on the substrate 11 and aligned with the color filters 14, 16, and 18 to provide individually addressable control of overlying portions of the layer of light emitting material 13 for emitting red, green, and blue colored light. It is noted that the layer 13 of light emitting materials forming the first white light elements is a continuous layer, thereby simplifying the manufacture of the device.

Common electrode 32 provides a second electrical connection for the emissive layer 13. Electrodes 34 and 36 provide power to the second light emitting element 20 that includes a light emitting layer 19. If the OLED device is top emitting, the electrodes 54, 56, and 58 may be reflective while the other electrodes are transparent. If the OLED device is bottom emitting, the electrode on the top of the stack may be reflective while the other electrodes are transparent. Transparent electrodes are well known in the art and, for example, may be made of indium tin oxide (ITO) or thin layers of metal such as silver. Reflective electrodes are also well known and may, for example, be composed of thicker layers of metals such as silver or aluminum. Alternatively, reflective layers known in the art may be placed beneath a transparent electrode to reflect light.

The design of the present invention provides a multi-element pixel wherein one of the elements 20 is white and the remainder 12 are colored. The structure provides an additional white pixel element that can be used as a high efficiency white light source without increasing the area of the pixel or decreasing the area of the colored pixel elements, thereby providing a more power efficient display with improved lifetime while maintaining the resolution of the display. Only one light emissive material is used and may be deposited in a continuous layer over the electrodes. Moreover, two of the four electrodes are common to all pixels 10. A third electrode (either 34 or 36) is independently addressable and is the same size as the pixel 10; the color controlling electrodes 54, 56, and 58 and the color filter arrays are the size of the independently addressable color elements. Therefore, the present invention provides a simple structure providing improved efficiency, lifetime, and a simplified manufacturing process.

White light emitting OLED elements are known in the prior art, for example, U.S. application Ser. No. 2002/0197511 A1 by D'Andrade et al., published Dec. 26, 2002. Such emissive materials can provide a very efficient white light source that is several times more efficient than a comparable colored light emitter. It is also known to use white light sources in conjunction with color filter arrays to provide a full color display. For example, a conventional, commercially available transmissive liquid crystal display (LCD) uses such an approach. With this conventional approach, a white light emitter is always more efficient than a colored emitter, since the colored emitter is a filtered version of the white emitter.

For clarification, within this application, the term "white light emitting element" is used to define any light emitting element that, when measured for color and plotted in CIE xy chromaticity coordinate space with the color of the other light emitting elements, is inside the gamut boundary produced by other light emitting elements. Using known OLED materials and color filters, this white light emitting element can be selected to have a luminous power efficiency that is higher than at least one of the light emitting elements that produce a color that defines the gamut of the display device.

Figure 3:
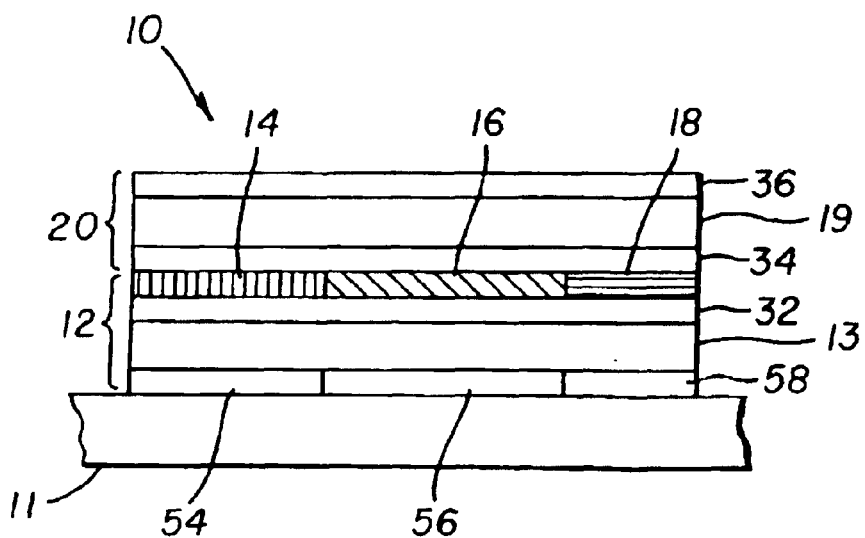
FIG. 3 is a schematic side view of a stacked OLED pixel having differently sized color filters according to an alternative embodiment of the present invention.

Although only a single emissive material is used in this invention, differences in the use of the material may affect the rate at which the materials associated with particulars colors may age. For example, if a pixel emits primarily red colors, the emissive materials located between electrode 54 and electrode 32 will age faster. Differences in aging related to usage differences can be accommodated by providing differently sized color controlling electrodes 54, 56, 58, and the corresponding filters 14, 16, and 18. Referring to FIG. 3, a pixel 10 having differently sized emissive areas for each of the different colors is shown.

Figure 4:
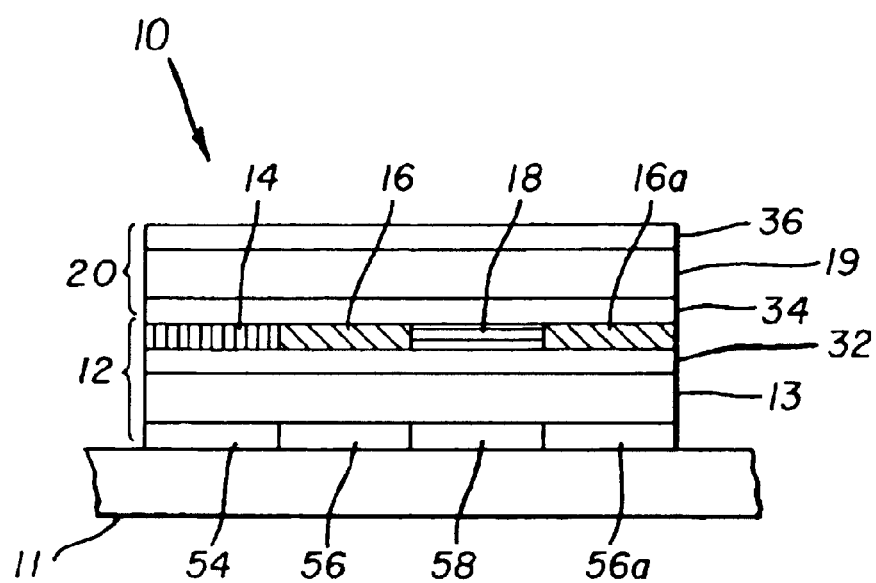
FIG. 4 is a schematic side view of a stacked OLED pixel according to an alternative embodiment of the present invention.

Other pixel structures having a plurality of spatially separated luminance elements (i.e. green and/or white light emitting elements) can provide a display device with higher spatial resolution while providing uniform luminance in flat fields of constant color. Since spatially separated green elements can improve the spatial resolution of a display, a plurality of green elements can also be employed in the pixel. Referring to FIG. 4, a pixel element 10 having light emitting elements that embodies this principle includes a plurality of individually addressable areas 16 and 16a emitting green light together with the associated electrodes 56 and 56a. A variety of such arrangements are possible.

According to the present invention, luminance that would conventionally be produced by a combination of all of the lower power efficiency color elements can instead be produced by the higher power efficiency white elements. Thus, any unsaturated color can be more efficiently reproduced by driving the white light emitting element together with one or more of the other colored light emitting elements. A suitable transformation function may be provided by a signal processor that converts a standard color image signal to a power saving image signal that is employed to drive the display of the present invention. For example, a simple transform is to calculate the minimum of the original red, green, and blue values and replace each of these color values with the same value less the minimum. The white value is set to the minimum. Applicants have done a study establishing that, on average, images displayed using a white light emitter that is at least three times as efficient as a color emitter (which is likely the case for color light created from filtered white light) will result in overall power savings of 50% in some applications.

Figure 5:
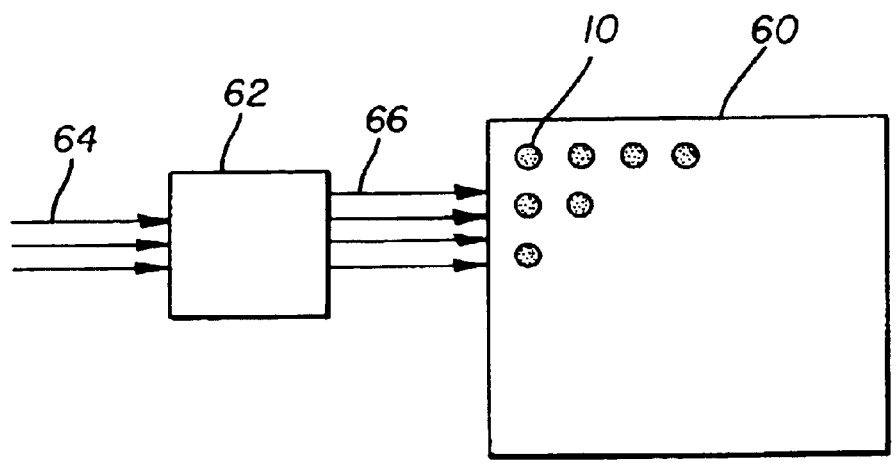
FIG. 5 is a schematic diagram showing an OLED display according to the present invention.

Referring to FIG. 5, a color OLED display having stacked pixels with color filters according to the present invention includes a display panel 60 having pixels 10 and a controller 62. The controller 62 converts a standard color image signal 64 to a power saving color image signal 66 suitable for driving the display panel 60, and can include a general purpose microprocessor or special purpose digital signal processing circuits as is known in the art.

The color of the additional white element 12 may be designed to match a desired white point of the display. In this case, the controller used to drive the display is configured to allow any gray value, including white, which would otherwise be presented using a combination of the color light emitting elements 12 to be created using primarily the white light emitting element 20. To achieve this, the peak luminance of the white light emitting element 20 is designed to match the combined luminance of the color light emitting elements 12. That is, in a typical configuration where the prior art display would be designed to achieve a peak luminance of 100 cd/sq. m, the color light emitting elements 12 will be set up to produce this peak luminance when they are all turned on to their maximum value and the additional light emitting element 20 will also be designed to provide this same peak luminance.

It should be noted however, that under certain circumstances it may be desirable to design the color of the additional white light emitting element 20 to provide a color point other than the display white point inside the gamut defined by the red, green, and blue elements 12. For example by biasing the color of the white light emitting element 20 towards the color of one of the other colored light emitting elements, the designer can reduce the reliance of the display on the colored light emitting element(s) toward which the additional element is biased. This approach can be used to adjust the relative lifetimes and/or power efficiency of the light emitting elements of the pixel.

It may also be desirable to set the peak luminance of the white element 20 to other luminance values, including lower values, such as half the luminance of the peak luminance of the combined color elements. This increases the reliance on the color elements 12 while reducing the reliance on the white element 20.

Once the display is designed to provide the correct luminance value for each light emitting element, suitable hardware is employed to map from a conventional three channel data signal to a four channel signal, for example using a suitable look-up table or matrix transform as is known in the art. Alternatively, the conversion may be accomplished real time using an algorithm (such as that described above) that specifies the conversion. The signal conversion is implemented in the controller 62.

It should be noted, that the signal conversion described above does not consider the spatial layout of the OLEDs within the display device. However, it is known that traditional input signals assume that all of the OLEDs used to compose a pixel are located in the same spatial location. Visually apparent artifacts that are produced as a result of having the different colored OLEDs at different spatial locations are often compensated through the use of spatial interpolation algorithms, such as the one discussed by Klompenhouwer et al. in the article entitled "Subpixel Image Scaling for Color Matrix Displays." These algorithms will, depending upon the spatial content of the image, adjust the drive signal for each OLED to reduce the visibility of spatial artifacts and improve the image quality of the display, particularly near the edges of objects within the image and will be applied in conjunction with or after the before-mentioned signal conversion is applied. It should be noted that the image quality improvement that is obtained near the edges of objects within the image is derived from increased sharpness of edges, decreases in the visibility of color fringing and improved edge smoothness. The spatial interpolation algorithm may be implemented in the signal converter 62.

Figure 6:
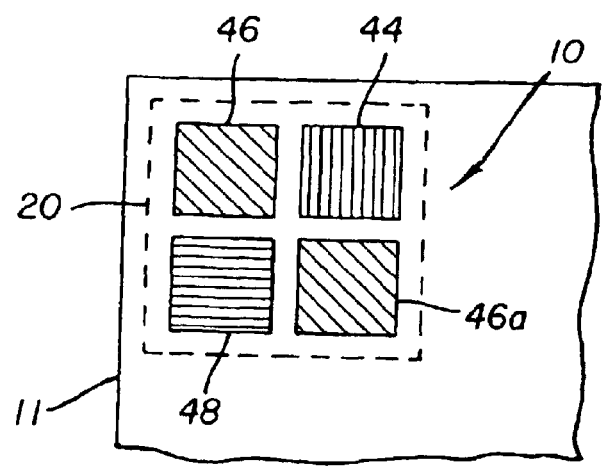
FIG. 6 is a partial top view of an OLED display according to an alternative embodiment of the present invention.

Referring to FIG. 6, a top view of the pixel 10 is shown having two green light emitting elements 46 and 46a, one red light emitting element 44, one blue light emitting element 48, and a white light emitting element 20 located above the colored elements; the red, green and blue light emitting elements each including an independently addressable white light emitting element and an associated color filter as described above.

Note that, as shown in FIG. 6, it is also possible that the white light emitting area may be slightly larger (or smaller, not shown) than the combined color light emitting areas. This is readily done in a top emitter configuration, since the emissive materials may be coated above control lines or active components in the device. It is also possible in a bottom emitter configuration, although in this configuration, emitted light may be obscured by the control lines or active components in the device. However, such arrangements may be preferred because they are more readily constructed.

Figure 7:
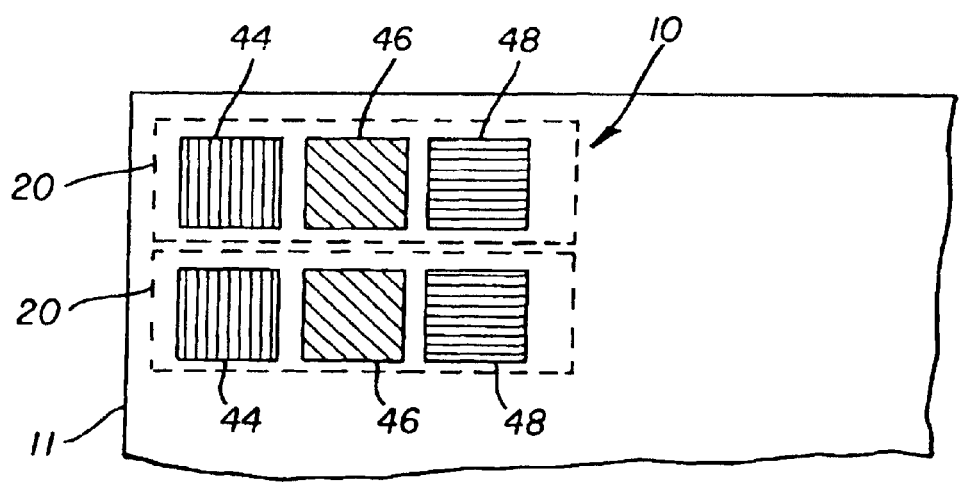
FIG. 7 is a partial top view of an OLED display according to an alternative embodiment of the present invention.
Figure 8:
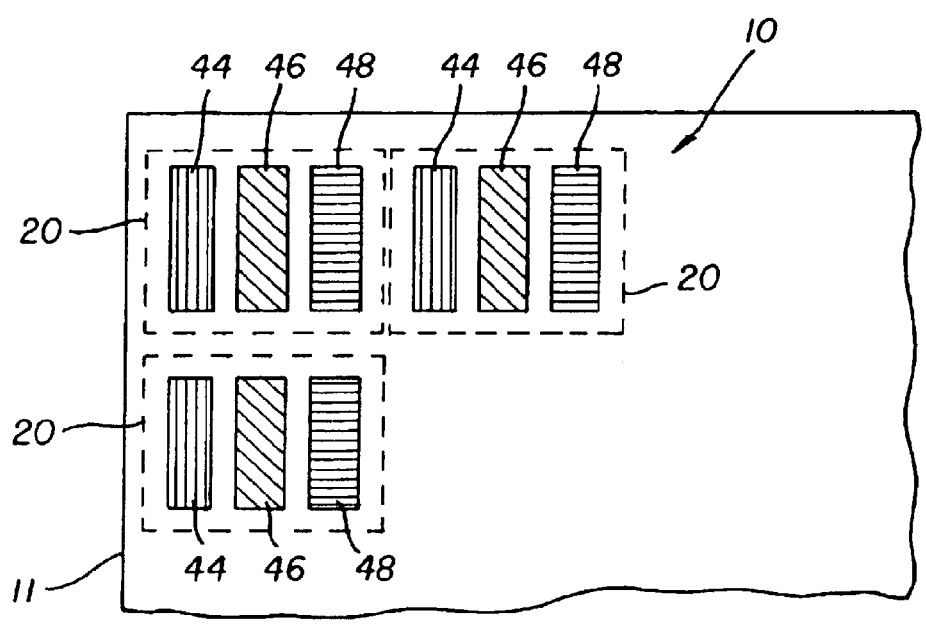
FIG. 8 is a partial top view of an OLED display according to an alternative embodiment of the present invention.

Alternative arrangements of light emitting elements with one element per color are possible. Referring to FIGS. 7 and 8, alternative pixel configurations according to the present invention include stripe arrangements with different aspect ratios. FIG. 7 illustrates pixels 10 arranged such that the light emitting elements form stripes of a common color wherein each color element 44, 46, or 48 is square and is arranged in a vertical stripe. The white light emitting element 20 is rectangular. Referring to FIG. 8, the color elements 12 are rectangular and the white light emitting element 20 and the pixel 10 can be more nearly square. These arrangements may also be made in rows rather than columns. Arrangements wherein the colors are not arranged in rows or columns are also possible, for example alternate rows may be offset from each other to form delta patterns.

Because the transform from three to four colors is non-deterministic (i.e. many colors in the conventional specification can be created with either combinations of the color elements alone, or in one of many combinations with the additional element), different conversions are possible. However, by selecting the peak luminance of the additional element to match the combined peak luminances of the gamut defining elements, it is possible to perform the conversion to allow the color element to provide as much luminance to each color as possible while maintaining saturation of all colors. This approach provides the maximum power savings possible with the present invention.

In the embodiments that have been discussed above, it is important to note that because the white light emitting element is significantly more efficient than at least one of the colored light emitting elements, the current density or power required to drive the white light emitting element is significantly lower than for at least one of the colored light emitting elements. It is also important to note that the luminance stability over time of the materials used to create the light emitting elements is typically related to the current density used to drive the elements through a very non-linear function in which the luminance stability over time of the material is much poorer when driven to higher current densities. In fact, the function used to describe this relationship can typically be described as a power function. For this reason, it is not desirable to drive any elements to current densities that are higher than a given threshold where the function describing the luminance stability over time is particularly steep. Under other circumstances, it may be desirable to achieve maximum display luminance values that would typically require the colored light emitting elements to be driven to this current density.

The present invention can be employed in most OLED device configurations that employ an efficient white light emitting element in each pixel. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

The invention has been described in detail with particular reference to certain preferred embodiments thereof, but it will be understood that variations and modifications can be effected within the spirit and scope of the invention.

PARTS LIST

| | |
|---|---|
| 10 | pixel |
| 11 | substrate |
| 12 | color light emitting element |
| $12_R$, $12_G$, $12_B$ | first white light emitting element |
| 13 | layer of white light emitting material |
| 14 | red filter |
| 16, 16a | green filter |
| 18 | blue filter |
| 19 | layer of white light emitting material |
| 20 | second white light emitting element |
| 25 | light |
| 32 | common electrode |
| 34 | electrode |
| 36 | electrode |
| 44 | red element |
| 46 | green element |
| 46a | green element |
| 48 | blue element |
| 54 | electrode |
| 56 | electrode |
| 56a | electrode |
| 58 | electrode |
| 60 | display |
| 62 | controller |
| 64 | color image signal |
| 66 | power saving color image signal |

What is claimed is:

1. An OLED device, having a pixel comprising:

a) a plurality of individually addressable first white light emitting elements;

b) a corresponding plurality of color filters located over the first white light emitting elements to filter the light emitted by the first white light emitting elements; and c) a second separately addressable white light emitting element located over the color filters for passing the filtered white light and emitting white light.

2. The OLED device claimed in claim 1, wherein the colors of the filters are red, green, and blue.

3. The OLED device claimed in claim 2, wherein the green color filter and corresponding first white light emitting element have a larger area than the red or blue color filter and corresponding first white light emitting elements.

4. The OLED device claimed in claim 1, wherein the first white light emitting elements and corresponding color filters are of different sizes.

5. The OLED device claimed in claim 4, wherein the relative sizes of first white light emitting elements and corresponding color filters correspond to the expected color usage of the display, wherein elements and corresponding filters having colors with greater expected usage are larger.

6. The OLED device claimed in claim 1, wherein two or more of the color filters are the same color.

7. The OLED device claimed in claim 6, wherein the two or more color filters are green.

8. The OLED device claimed in claim 1, wherein the total area of the first white light emitting element is different than the area of the second white light emitting element.

9. The OLED device claimed in claim 1, wherein the first and second white light emitting elements are composed of the same light emitting materials.

10. The OLED device claimed in claim 1, wherein the white point of white light elements matches the white point of the display.

11. The OLED device claimed in claim 1 wherein the white point of the white light emitting elements matches the white point of color filters.

12. The OLED device claimed in claim 1, wherein the color filters are absorption filters.

13. The OLED device claimed in claim 1, wherein the color filters are dichroic filters.

14. The OLED device claimed in claim 1, wherein the OLED device is a top emitting device.

15. The OLED device claimed in claim 1, wherein the OLED device is a bottom emitting device.

16. The OLED device claimed in claim 1, wherein the pixel has a square shape and the color filters and first white light emitting elements are arranged in a stripe pattern in the square shape.

17. The OLED device claimed in claim 1, wherein the pixel has a square shape and the color filters and first white light emitting elements are arranged in rectangular array in the square shape.

18. The OLED device claimed in claim 1, wherein the color filters include a clear filter.

19. The OLED device claimed in claim 1, further comprising a controller for converting an RGB color image signal to an RGBW signal.

20. The OLED device claimed in claim 19, wherein the controller determines the minimum (MIN) of the RGB signal and produces the RGBW signal as R=R-MIN, G=G-MIN, B=B-MIN, W=MIN.

21. An OLED device, comprising:

a) a substrate;

b) a first addressable white light emitting element formed on the substrate;

c) a color filter located over the first white light emitting element; and d) a second separately addressable white light emitting element located over the color filter.

22. The OLED device claimed in claim 21, wherein the OLED device is a top emitting device, and the color filter filters the light from the first white light emitting element.

23. The OLED device claimed in claim 22, further comprising a reflector located between the first white light emitting element and the substrate.

24. The OLED device claimed in claim 23, wherein the reflector comprises an electrode.

25. The OLED device claimed in claim 21, wherein the OLED device is a bottom emitting device, and the color filter filters the light from the second white light emitting element.

26. The OLED device claimed in claim 25, further comprising a reflector located over the second white light emitting element.

27. The OLED device claimed in claim 26, wherein the reflector comprises an electrode.

* * * * *